United States Patent
Aoki

[19]

[11] Patent Number: 6,036,581
[45] Date of Patent: Mar. 14, 2000

[54] SUBSTRATE CLEANING METHOD AND APPARATUS

[75] Inventor: Hidemitsu Aoki, Tokyo, Japan

[73] Assignee: NEC Corporation, Tokyo, Japan

[21] Appl. No.: 09/084,013

[22] Filed: May 26, 1998

[30] Foreign Application Priority Data

May 26, 1997 [JP] Japan ..................................... 9-134603

[51] Int. Cl.$^7$ .................................................... B24B 1/00
[52] U.S. Cl. ............................................... 451/39; 451/83
[58] Field of Search .................................. 451/38, 39, 40, 451/80, 82, 83, 451

[56] References Cited

U.S. PATENT DOCUMENTS

| | | | |
|---|---|---|---|
| 4,132,567 | 1/1979 | Blackwood | 134/1 |
| 5,123,207 | 6/1992 | Gillis, Jr. et al. | 51/426 |
| 5,315,793 | 5/1994 | Peterson et al. | 51/415 |
| 5,486,128 | 1/1996 | Tsuchiya et al. | 451/2 |
| 5,512,106 | 4/1996 | Tamai et al. . | |
| 5,651,723 | 7/1997 | Bjornard et al. | 451/39 |
| 5,836,809 | 11/1998 | Kosic | 451/89 |
| 5,837,064 | 11/1998 | Bowers | 134/6 |

FOREIGN PATENT DOCUMENTS 6-283488  10/1994  Japan .

OTHER PUBLICATIONS

Wayne T. McDermott, et al., Removing submicron surface particles using a cryogenic argon–aerosol technique, Microcontamination, Oct. 1991, pp. 33–36; 94–95.

Wayne T. McDermott et al., Surface cleaning by a cryogenic argon aerosol, 1991 Proceedings—Inst. of Environ. Sci.

*Primary Examiner*—Timothy V. Eley
*Assistant Examiner*—Dung Van Nguyen
*Attorney, Agent, or Firm*—Foley & Lardner

[57] ABSTRACT

A substrate cleaning method includes the steps of supplying a cleaning fluid containing fine argon particles or fine carbon dioxide gas particles to a nozzle unit which is accommodated in a vacuum container and in which spray nozzle holes are arranged to blow the cleaning fluid toward a plurality of spaces, where a plurality of cleaning target substrates are respectively arranged, from front and back sides simultaneously, discharging the fluid outside the vacuum container to maintain an interior of the vacuum container in vacuum, arranging and fixing the plurality of cleaning target substrates respectively in the plurality of spaces and cleaning the cleaning target substrates while vertically moving either one of the cleaning target substrates and the nozzle unit so that the cleaning target substrates and the nozzle unit vertically move relative to each other, and supplying a discharge fluid, which constantly discharges the cleaning fluid from the spaces, from above the cleaning target substrates. An apparatus for practicing this method is also disclosed.

8 Claims, 7 Drawing Sheets

SUBSTRATE CLEANING METHOD AND APPARATUS

BACKGROUND OF THE INVENTION

1. Field of the Invention

The present invention relates to a cleaning method and apparatus and, more particularly, to a cleaning method and apparatus suitable for cleaning the surface of a substrate such as a semiconductor substrate and a liquid crystal substrate.

2. Description of the Prior Art

In the manufacture of a semiconductor device, to clean the semiconductor substrate having a surface on which semiconductor elements are formed at a high density is an indispensable important step. As the semiconductor devices are integrated and micropatterned, to effectively remove even fine-particle contamination is necessary in order to improve the yield of the manufacture of the semiconductor devices. In particular, after a film deposition step or a dry etching step where particle contamination tends to occur, cleaning with an ammonia-hydrogen peroxide solution mixture is conventionally performed.

A wet cleaning method using such a chemical solution causes excessive etching and degrades the reliability of the device. In addition, since a large amount of chemical solution must be used, the load to the environment increases. To replace this wet cleaning technique, Ar aerosol cleaning is under development.

According to Ar aerosol cleaning, first, Ar gas is precooled by using liquid nitrogen or a refrigerating machine. The precooled Ar gas is sprayed into a low-pressure space through spray nozzle holes to cause adiabatic expansion, so that a fluid containing solidified fine Ar particles (this liquid will be referred to as Ar aerosol hereinafter) is generated. This Ar aerosol is blown toward the wafer to bombard the solidified fine particles described above against the wafer to remove particle contamination on the wafer and side-wall deposition films (this cleaning method will be referred to as Ar aerosol cleaning hereinafter).

FIG. 1 shows a schematic diagram of a conventional cleaning apparatus. The wafer stage is moved back and forth with respect to spray nozzle holes 4a so as to blow Ar aerosol 5 sprayed from the spray nozzle holes 4a toward the entire surface of a wafer 8. This method is disclosed in the specification of Japanese Unexamined Patent Publication No. 6-283488. Referring to FIG. 1, a rod-like nozzle unit 4 is arranged to be substantially perpendicular to the moving direction of the wafer 8 and to be parallel to the wafer 8. The Ar aerosol 5 sprayed from the spray nozzle holes 4a blows off contaminant particles 7 attaching to the wafer 8. The free contaminant particles 7 are removed in a direction substantially parallel to the substrate.

According to the conventional Ar aerosol cleaning apparatus, since fine Ar particles (Ar aerosol) are blown toward only the upper surface of the wafer, the lower surface of the wafer cannot be processed, leading to a low processing efficiency. Since the Ar aerosol and the free contaminant particles are removed in the horizontal direction, unless the exhaust system is well devised, the contaminant particles may fall on the substrate to attach to it again.

SUMMARY OF THE INVENTION

The present invention has been made in view of the above situation of the prior art, and has as its object to provide a cleaning method and apparatus in which a cleaning fluid of argon gas or carbon dioxide gas is blown toward the substrates to process the two surfaces of each of a plurality of wafers simultaneously, and reattaching of the removed contaminant particles is prevented, so that the substrate processing efficiency and the cleanness of the processed substrate can be improved.

In order to achieve the above object, according to the principal aspect of the cleaning method of the present invention, there is provided a substrate cleaning method comprising the steps of supplying a cleaning fluid containing fine argon particles or fine carbon dioxide gas particles to a nozzle unit which is accommodated in a vacuum container and in which spray nozzle holes are arranged to blow the cleaning fluid toward a plurality of spaces, where a plurality of cleaning target substrates are respectively arranged, from front and back sides simultaneously, discharging the fluid outside the vacuum container to maintain an interior of the vacuum container in vacuum, arranging and fixing the plurality of cleaning target substrates respectively in the plurality of spaces and cleaning the cleaning target substrates while vertically moving either one of the cleaning target substrates and the nozzle unit so that the cleaning target substrates and the nozzle unit vertically move relative to each other, and supplying a discharge fluid, which constantly discharges the cleaning fluid from the spaces, from above the cleaning target substrates.

The cleaning target substrates can be rotated during the step of cleaning the cleaning target substrates in the principal aspect.

In order to achieve the above object, according to the principal aspect of the cleaning apparatus of the present invention, there is provided a substrate cleaning apparatus comprising a nozzle unit in which spray nozzle holes are arranged to blow a cleaning fluid toward a plurality of spaces, where a plurality of cleaning target substrates are respectively arranged, from front and back sides simultaneously, a cleaning fluid supply unit for supplying the cleaning fluid containing fine argon particles or fine carbon dioxide gas particles to the nozzle unit, holding means for fixing the plurality of cleaning target substrates respectively arranged in the plurality of spaces, a drive unit for vertically moving either one of the cleaning target substrates and the nozzle unit so that the cleaning target substrates and the nozzle unit vertically move relative to each other, a discharge fluid supply unit for supplying a discharge fluid, which forms a flow that causes the cleaning fluid to be constantly discharged from the spaces, from above the cleaning target substrates, and a vacuum container accommodating the nozzle unit, the drive unit, the holding means, and the discharge fluid supply unit, and exhaust means for discharging a fluid outside the vacuum container to constantly maintain an interior of the vacuum container in vacuum.

The nozzle unit serving a major role in the cleaning apparatus comprises a common pipe and a plurality of nozzle pipes branching from the common pipe in a comb-like manner. Each of the nozzle pipes has a plurality of spray nozzle holes formed at a predetermined pitch.

Furthermore, the holding means in the above cleaning apparatus of the principal aspect comprises roller-like retainers each having a U- or V-shaped groove in a circumferential portion thereof. Each cleaning target substrate is fixed with the retainers arranged at at least three portions.

As is understood from the above aspects, when cleaning is performed by using the cleaning apparatus of the present invention and in accordance with the cleaning method of the present invention, the front and back surfaces of each of the plurality of substrates can be cleaned simultaneously. Hence, the substrate cleaning efficiency is improved and the manufacturing ability is improved. Since the cleaning fluid is constantly discharged with the discharge fluid, the deposit and contaminants separated from the substrates will not attach to the substrates again. As a result, the deposit or contaminant removal rate is improved. Accordingly, the reliability of an electronic device using a substrate processed by the present invention is improved.

The above and many other objects, features and advantages of the present invention will become manifest to those skilled in the art upon making reference to the following detailed description and accompanying drawings in which a preferred embodiment incorporating the principles of the present invention are shown by way of an illustrative example.

DETAILED DESCRIPTION OF THE PREFERRED EMBODIMENT

Figure 1:
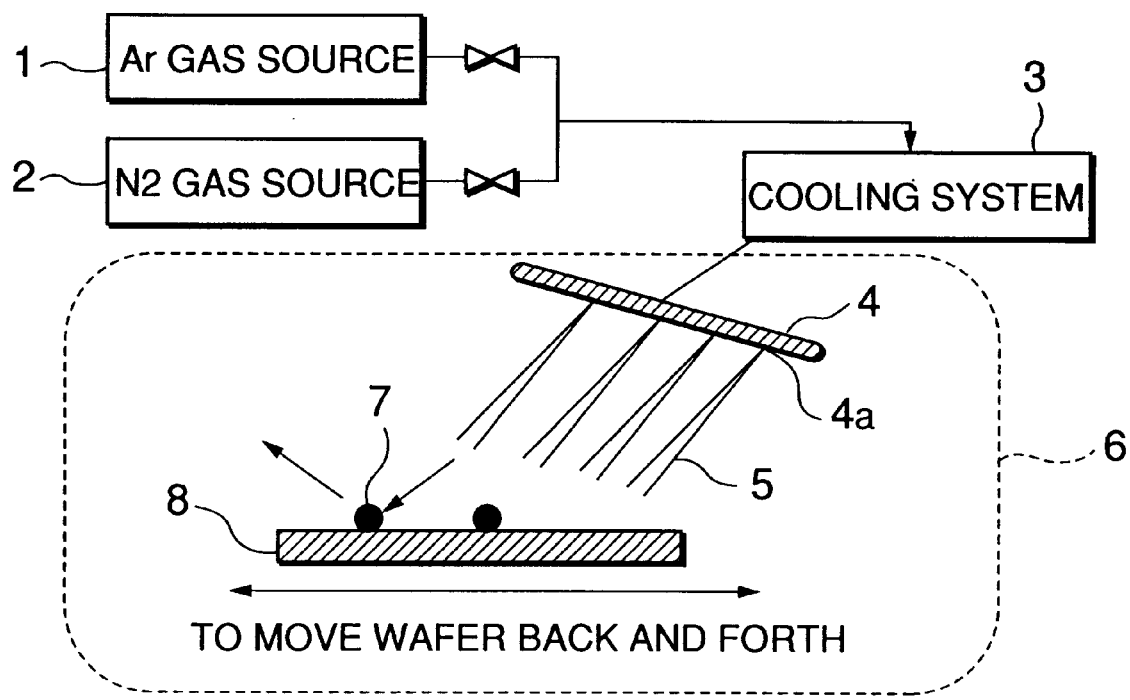
FIG. 1 is a schematic diagram showing one prior art.

The present invention will be described in further detail with reference to a preferred embodiment shown in the accompanying drawings.

According to the cleaning method of the present invention, first, a cleaning fluid containing fine argon particles or fine carbon dioxide gas particles (Ar aerosol or $CO_2$ aerosol) is supplied to a nozzle unit accommodated in a vacuum container. The nozzle unit can clean a plurality of cleaning target substrates arranged in the vacuum container. It is preferable for the nozzle unit if the cleaning target substrates are arranged vertically at a predetermined interval to form a horizontal array.

The nozzle unit is arranged to blow the cleaning fluid toward the two sides of the respective cleaning target substrates that are set to oppose the nozzle unit. More specifically, the nozzle unit has a common pipe for supplying the cleaning fluid, and a plurality of nozzle pipes branching from the common pipe in a comb-like manner and each formed with a plurality of spray nozzle holes. Each nozzle pipe is arranged such that its spray nozzle holes perform the cleaning fluid blowing function. When the cleaning fluid is supplied to the nozzle unit, the nozzle unit can spray the cleaning fluid into the respective spaces, where the cleaning target substrates should be set, from front and back sides.

The fluid in the vacuum container is constantly exhausted to the outside to maintain the interior of the vacuum container in vacuum. The fine argon particles or fine carbon dioxide gas particles blown into the vacuum atmosphere are changed to solid particles due to rapid temperature drop caused by adiabatic expansion. The cleaning fluid to be supplied must have a predetermined pressure and is precooled as required.

When the cleaning target substrates are arranged to oppose the respective nozzle pipes of the nozzle unit, the cleaning fluid is blown toward the respective cleaning target substrates in the two directions simultaneously. The cleaning target substrates and the spray nozzle holes must move vertically relatively to each other so that the cleaning fluid is blown to the entire cleaning target substrates. For this purpose, either the cleaning target substrates or the nozzle unit is moved vertically to clean the entire cleaning target substrates. The fine argon solid particles or fine carbon dioxide solid particles blow off the deposit or fine contaminant particles attaching to the two surfaces of each cleaning target substrate.

Simultaneously, a discharge fluid for discharging the cleaning fluid containing deposit pieces and the contaminant particles is supplied from above the cleaning target substrates. As the discharge fluid, nitrogen gas or the like may be used. The cleaning fluid containing the deposit pieces and fine contaminant particles is discharged toward the lower side of the cleaning target substrates. The cleaning fluid and discharge fluid containing the deposit pieces and fine contaminant particles are exhausted outside the vacuum container, and the interior of the vacuum container is accordingly maintained in vacuum. The discharge fluid is precooled as required.

The cleaning apparatus according to the present invention has the arrangement as described above and holding members for arranging and fixing the cleaning target substrates in the space.

Furthermore, the cleaning apparatus has a drive unit 11a which can vertically move either the cleaning target substrates 10 or nozzle unit 9. When the drive unit 11a is actuated, the cleaning target substrates 10 and the spray nozzle hole 9a moved vertically relative to each other, so that the cleaning fluid is blown toward the entire cleaning target substrates 10. The cleaning apparatus also has a discharge fluid supply unit 14 to supply the discharge fluid 12 from above the cleaning target substrates and to discharge the discharge fluid 12 toward the lower portion of the cleaning target substrates.

The cleaning apparatus also has a vacuum container 6 which accommodates the nozzle unit 9, the drive unit 11a, the holding members 11, and the discharge fluid supply unit 14, and an exhaust means 13 for exhausting the fluid outside the vacuum container to maintain the interior of the vacuum container in vacuum. Before the apparatus is actuated, the exhaust means discharges the internal air in the vacuum container to set it in vacuum. While the apparatus operates, the exhaust means exhausts the cleaning fluid and discharge fluid containing the separated contaminant particles and the like, so that the interior of the vacuum container is maintained at a predetermined vacuum degree. Since the cleaning fluid is discharged into vacuum, the fine argon particles or fine carbon dioxide gas particles are changed to solid particles due to rapid temperature drop caused by adiabatic expansion. The cleaning fluid to be supplied must have a predetermined pressure and is precooled as required. The solid argon particles or solid carbon dioxide particles remove the deposit and contaminant particles attaching to the two sides of each cleaning target substrate by blowing.

Since the discharge fluid is supplied from above the cleaning target substrates and flows toward the lower side of the cleaning target substrates, the free deposit pieces and contaminant particles are discharged outside the cleaning target substrate area without attaching to the cleaning target substrates again. The discharge fluid is precooled as required.

The nozzle unit may be constituted by a common pipe and a plurality of nozzle pipes. Each nozzle pipe may have a plurality of spray nozzle holes formed at a predetermined pitch. The nozzle pipes may branch from the common pipe in a comb-like manner. The holding member may have a roller-like retainer having a U- or V-shaped groove, and each cleaning target substrate is fixed with the holding members at least at three portions.

FIGS. 2, 3A and 3B, and 4 show the basic arrangement of a cleaning apparatus, i.e., an aerosol cleaning apparatus, according to the embodiment of the present invention. The process of generating Ar aerosol is substantially the same as that of the conventional method. As the cleaning gas, Ar gas and $N_2$ gas are supplied from an Ar gas source 1 and an $N_2$ gas source 2, respectively, to form a gas mixture of the Ar gas and $N_2$ gas. The gas mixture is precooled to a temperature of 80° K to 150° K by a cooling system 3. As the gas sources 1 and 2, gas cylinders or gas systems provided to the factory are used. The Ar gas source 1 and $N_2$ gas source 2 must have predetermined supply pressures. The cooling system 3 uses a refrigerating machine or liquid nitrogen. Prior to the start of the operation of the cleaning apparatus, air in a vacuum container 6 is discharged by an exhaust unit 13 so as to evacuate the interior of the vacuum container 6 to a vacuum pressure of 10 KPa to 100 KPa. As the exhaust unit 13, a vacuum pump or the like is used.

The gas mixture of the Ar gas and $N_2$ gas as the cleaning gas (alternatively only Ar gas can be used) is sprayed into the vacuum container 6 having an air-tight structure from spray nozzle holes 9a formed in a plurality of nozzle pipes 9b branching from a common pipe 9c of a nozzle unit 9 in a comb-like manner. At this time, the pressure of the gas decreases rapidly to cause adiabatic expansion and also to decrease the temperature of the gas rapidly, so that the Ar gas forms Ar aerosol 5 containing fine solid particles (Joule-Thomson effect). The flow speed of the gas is set to 1 m/s to 10 m/s. The common pipe 9c is one straight pipe arranged horizontally, and the nozzle pipes 9b branch from the common pipe 9c at a constant interval in the horizontal direction to be perpendicular to the common pipe 9c. The extending lengths of the nozzle pipes 9b from the common pipe 9c are constant.

Figure 3A:
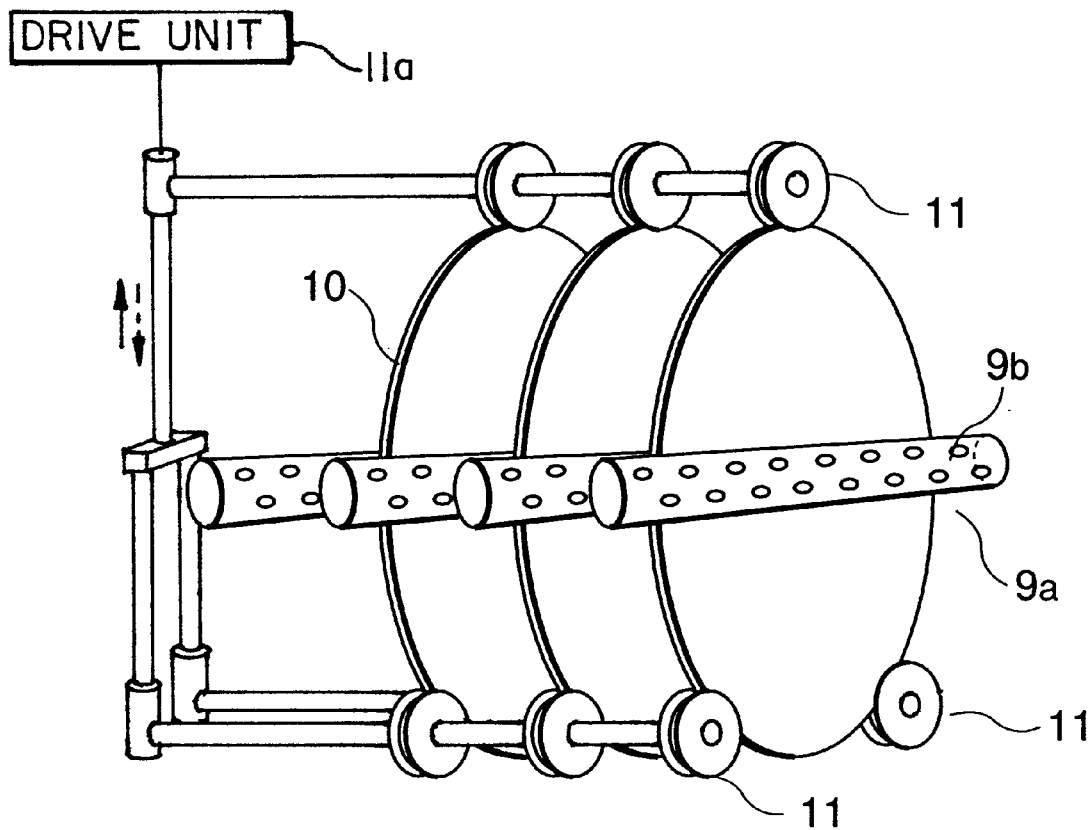
FIG. 3A is a schematic perspective view showing the cleaning target substrate holding members and the cleaning portions.
Figure 4:
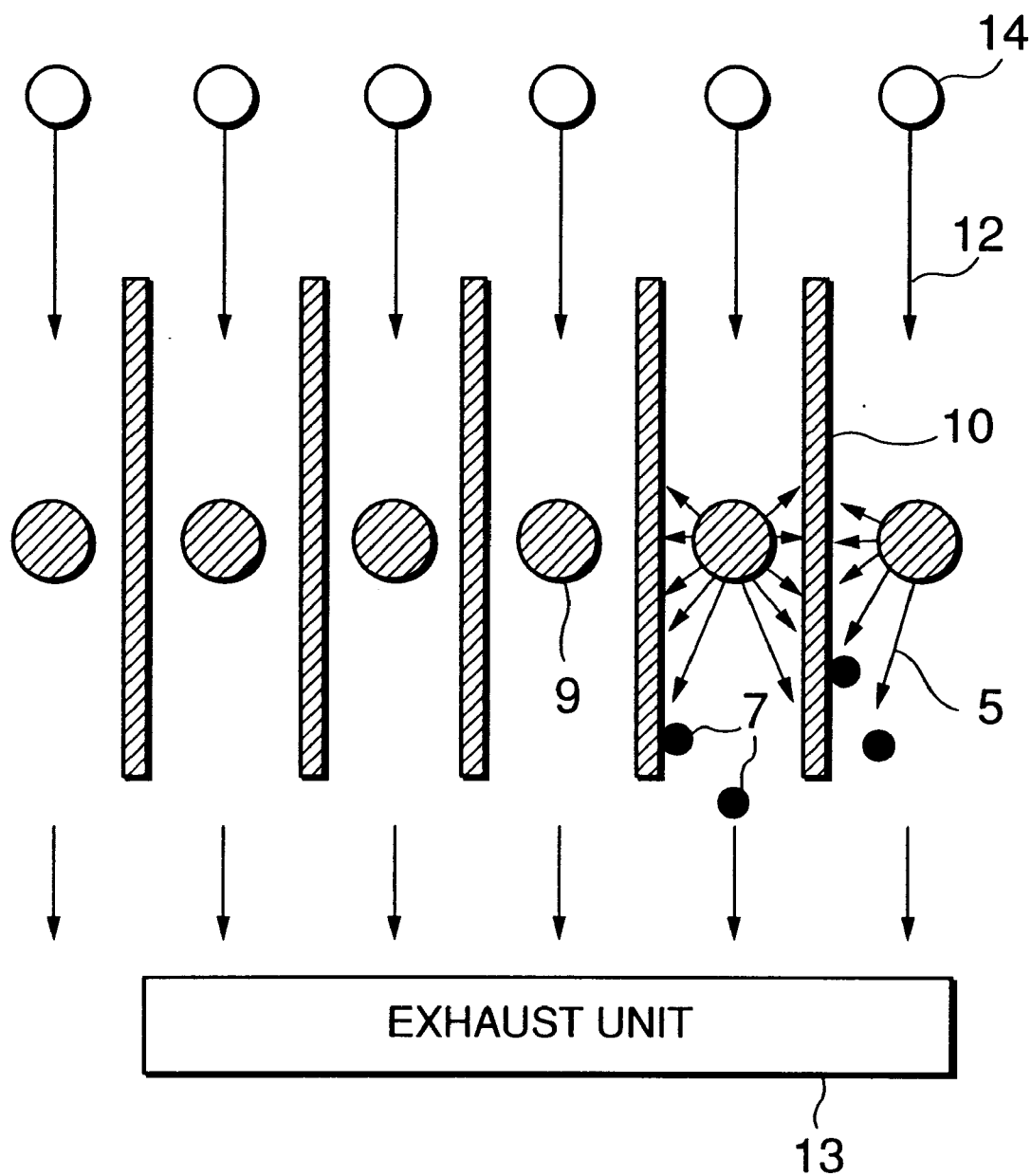
FIG. 4 is a diagram, seen from one side, of a portion of the embodiment shown in FIG. 2.

The branch portions of the nozzle unit 9 are constituted by the nozzle pipes 9b each having a circular section, as shown in FIG. 3A, and wafers 10 as the processing target substrates are vertically inserted among the nozzle pipes 9b respectively such that they are separated from each other by a predetermined gap. It is preferable that the length of each nozzle pipe 9b be larger than the diameter of the wafer 10, that the diameter of each nozzle pipe 9b be 3 mm to 15 mm, that the minimum distance between the wafer 10 and the nozzle pipe 9b be 0.3 mm to 10 mm, and that the diameter of the spray nozzle hole 9a be about 0.1 mm to 2 mm. In FIG. 4, the wafers 10 are moved vertically on the surface of the sheet of drawing, and the Ar aerosol blown from the spray nozzles blows off the deposit and contaminant particles 7 attaching to the wafers 10, thereby cleaning the wafers 10.

Figure 2:
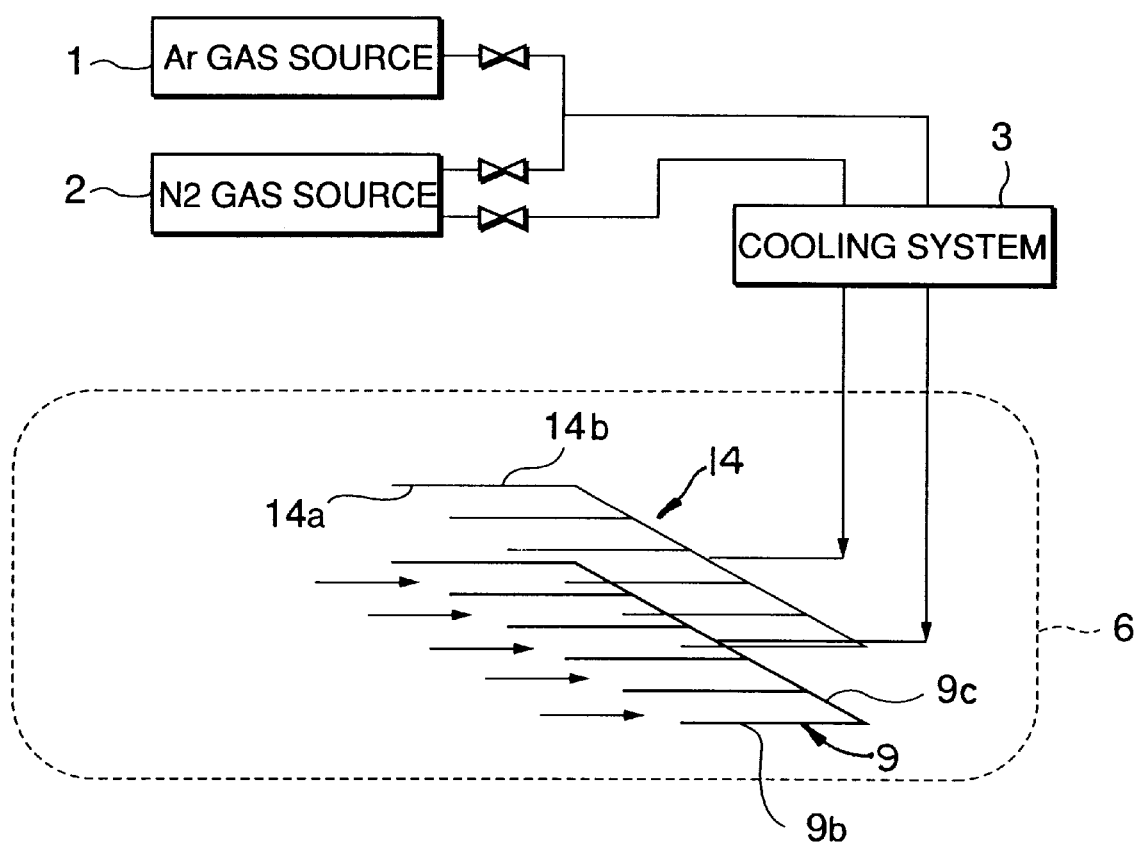
FIG. 2 is a schematic diagram showing the arrangement of the embodiment of the present invention.

The spray nozzle holes 9a are formed at a constant pitch in the radial and longitudinal directions, and more spray nozzle holes 9a are formed in the lower half than in the upper half of each nozzle pipe 9b, having a circular section, with respect to the horizontal center line, so that the flow of the Ar aerosol 5 is directed downward as a whole. As shown in FIG. 2, an $N_2$ carrier gas pipe 14b is connected to the $N_2$ gas source 2. After precooled to a predetermined temperature by the cooling system 3, the $N_2$ carrier gas 12 is supplied from above the wafers 10 downward. Hence, the contamination particles separated from the wafers 10 by the lower exhaust unit 13 are effectively discharged downward through the gaps of the wafers, and are then exhausted outside the vacuum container 6. The $N_2$ carrier gas pipe 14b also has pipe portions branching from a common pipe portion in a comb-like manner. Spray nozzle holes 14a are formed in the bottom portion of each branch pipe portion at a constant pitch in the longitudinal direction. The diameter of the spray nozzle holes 14a is preferably set to about 0.1 mm to 1 mm.

Figure 3B:
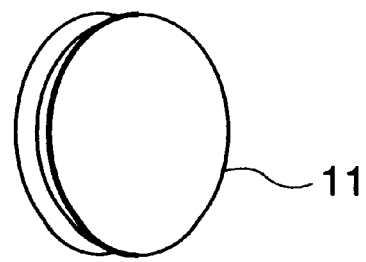
FIG. 3B is an enlarged perspective view of one of the holding members shown in FIG. 3A.

The wafers 10 are moved vertically by the operation of the drive unit 11a so that the Ar aerosol 5 sprayed from the spray nozzle holes 9a sufficiently spreads over the entire surfaces of the wafers 10. This vertical movement is performed about 10 to 100 times during the substrate cleaning step. The wafers 10 are securely fixed with substrate holding members 11 so as not to vibrated upon vertical movement and bombardment of the Ar aerosol 5 against them. Each substrate holding member 11 preferably has a roller shape having a shallow U- or V-shaped groove, as shown in FIG. 3B, and one wafer 10 must be fixed with the substrate holding members 11 at at least three portions.

The wafers 10 may not only be moved vertically but also be rotated. The wafers 10 may be fixed, and the nozzle unit 9 may be moved vertically. Although the number of wafers 10 in one group is 5 in FIGS. 2 and 4, it is usually 25 to 50, and can be a number falling outside this range. An appropriate number wafers is determined in accordance with the design of the cleaning apparatus.

After processing, the group of wafers 10 are removed from the processing positions by moving the substrate holding members 11 downward. While this group of wafers 10 are being processed in the vacuum container 6, another group of wafers 10 to be processed next wait in a preliminary vacuum container (not shown) adjacent to the vacuum container 6. This next group of non-processed wafers 10 are transferred from the preliminary vacuum container to the vacuum container 6, are inserted among the nozzle pipes 9b in the same manner, and are fixed with the substrate holding members 11, thus completing setting of the wafers 10 to the processing positions. The group of processed wafers 10 are exchanged for the group of non-processed wafers 10 and are transferred into the preliminary vacuum container. The space in the preliminary vacuum container can be separated from the space in the vacuum container 6.

Subsequently, the space in the preliminary vacuum container is separated from the space in the vacuum container 6, and the pressure of only the preliminary vacuum container is open to the atmosphere. Thereafter, the processed wafers 10 are extracted from the preliminary vacuum container to the atmosphere side, and the wafers 10 to be processed next are loaded in the preliminary vacuum container.

After loading and unloading of the wafers 10 are ended, the preliminary vacuum container is evacuated until it reaches a vacuum degree equal to that of the vacuum container 6. When the vacuum degree becomes equal to that of the vacuum container 6, separation of the preliminary vacuum container is canceled, and the preliminary vacuum container is connected to the vacuum container 6. Thereafter, the unprocessed wafers 10 are transferred from the preliminary vacuum container to the processing positions in the vacuum container 6, and the processed wafers 10 are transferred from the vacuum container 6 to the preliminary vacuum container. Then, an operation identical to that described above is repeated.

Figure 5:
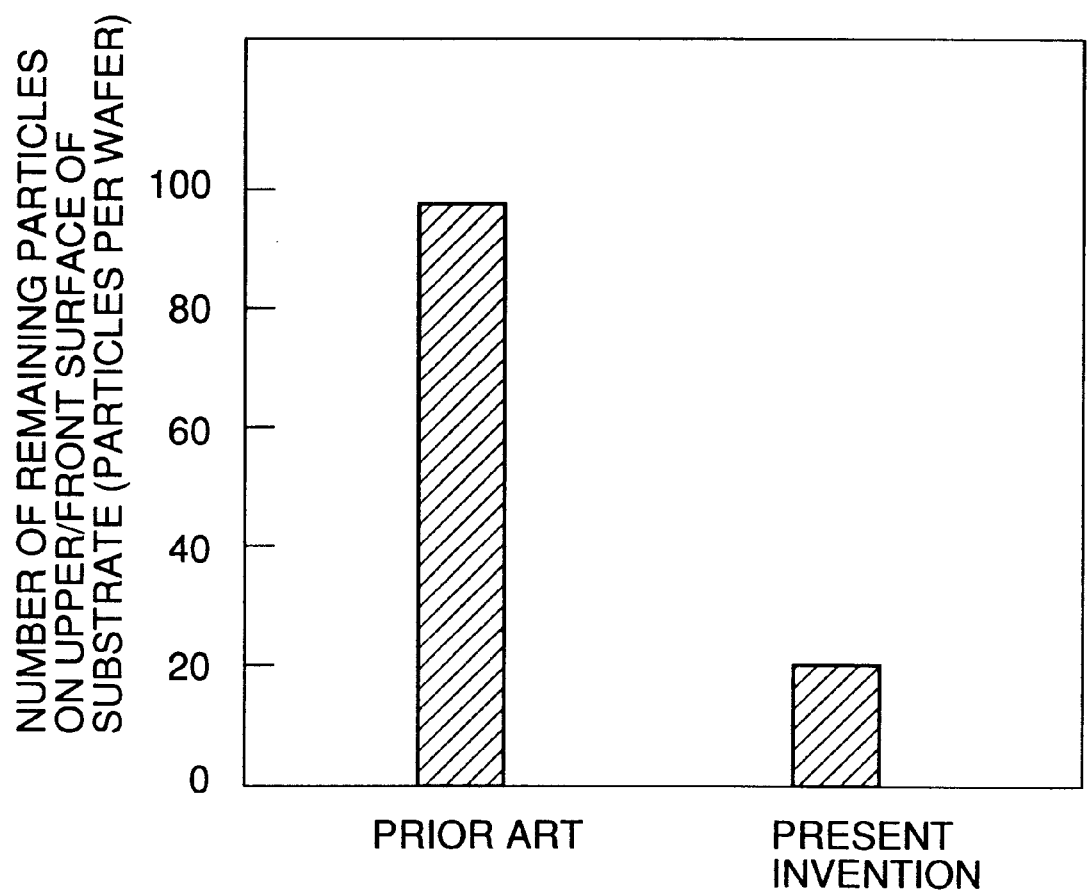
FIGS. 5 and 6 are graphs respectively showing the number of remaining particles on the surfaces of the substrate by way of comparison between the prior art and the embodiment of the present invention.
Figure 6:
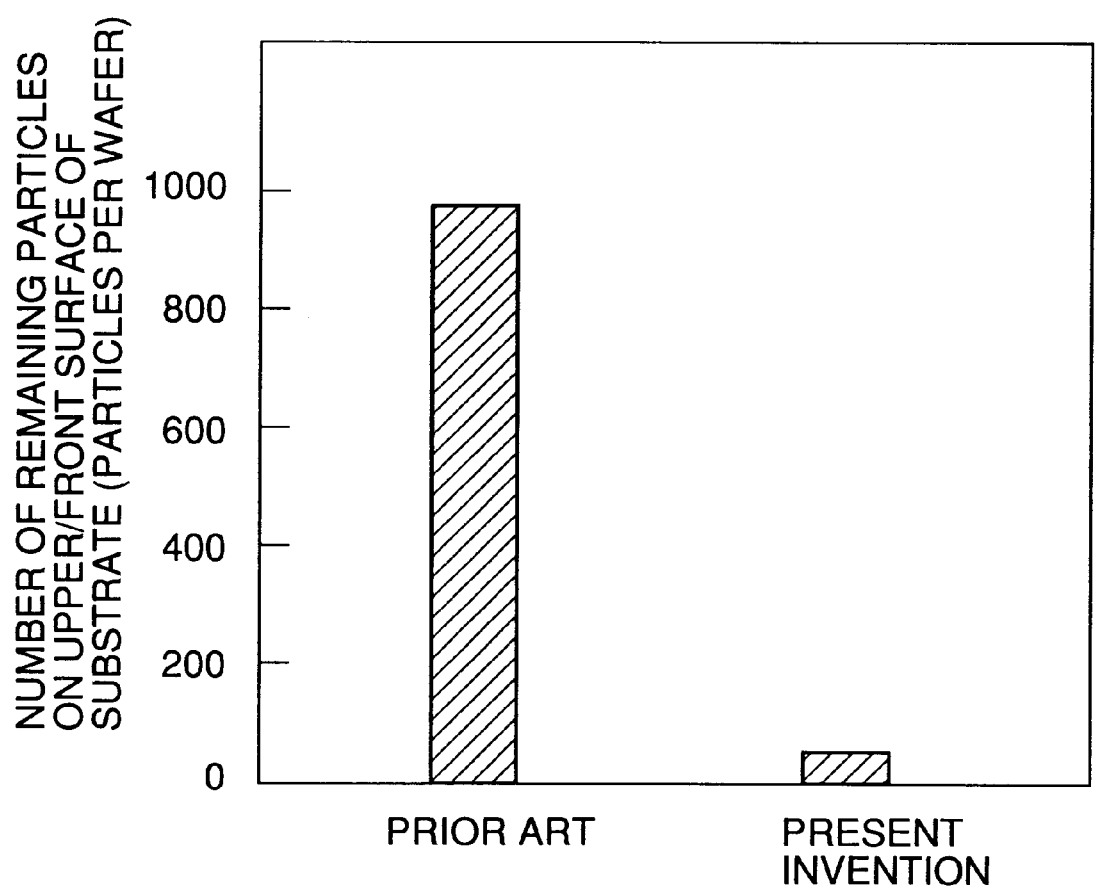
Figure 7:
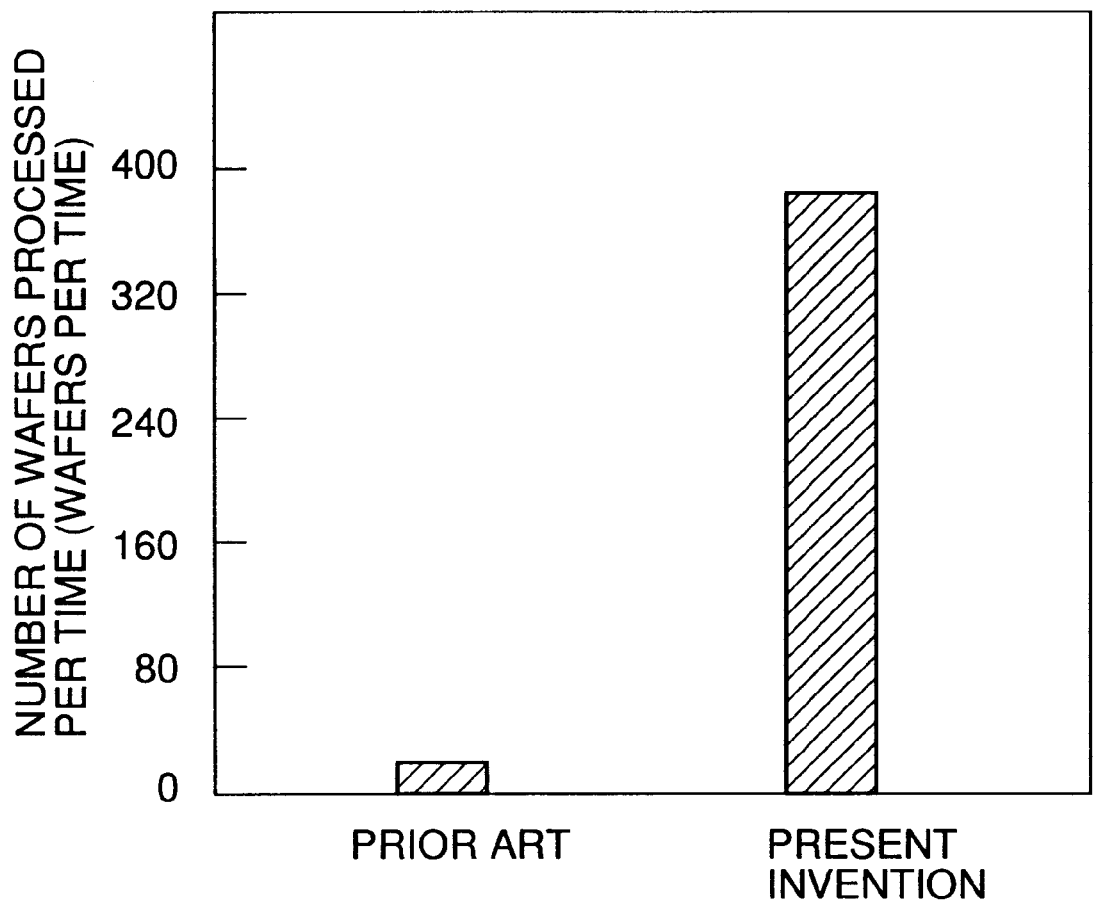
FIG. 7 is a graph showing the number of wafers cleaned per unit time by way of comparison between the prior art and the embodiment of the present invention.

FIGS. 5 to 7 show examples of the comparison result between the prior art and the present invention.

FIG. 5 is a graph showing comparison between the prior art and the present invention concerning the number of remaining particles on the upper/front surface of the substrate.

When the cleaning method according to the present invention is employed, the number of particles remaining on the upper/front surface of the substrate can be reduced to a fraction of that of the prior art. This is because the separated contaminant particles are carried on the $N_2$ carrier gas supplied from above and are removed effectively in the direction of gravity to the outside of the wafer area.

FIG. 6 is a graph showing comparison between the prior art and the present invention concerning the number of remaining particles on the lower/back surface of the substrate.

When the cleaning method according to the present invention is employed, the number of particles remaining on the lower/back surface of the substrate can be reduced to a fraction of several ten times that of the prior art. This is because the prior art does not have a mechanism that removes the contaminant particles on the lower and upper surfaces of the substrate simultaneously.

FIG. 7 is a graph showing comparison between the prior art and the present invention concerning the number of substrates processed per unit time. Assume that 25 wafers are to be processed by batch processing in accordance with the present invention. When the time that takes in the present invention is compared with the time that takes for processing only the upper surface of the substrate in accordance with the prior art, the number of wafers that can be processed per hour is improved to 20 times or more. When this result is compared with the prior art wherein the upper and lower surfaces of the substrate are processed separately, a processing ability of 40 or more times can be obtained.

What I claim is:

1. A substrate cleaning method comprising the steps of:
   supplying a cleaning fluid containing fine argon particles or fine carbon dioxide gas particles to a nozzle unit which is accommodated in a vacuum container and in which spray nozzle holes are arranged to blow said cleaning fluid toward a plurality of spaces, where a plurality of cleaning target substrates are respectively arranged, from front and back sides simultaneously;
   discharging said fluid outside said vacuum container to maintain an interior of said vacuum container in vacuum;
   arranging and fixing the plurality of cleaning target substrates respectively in said plurality of spaces and cleaning the cleaning target substrates while vertically moving either one of the cleaning target substrates and said nozzle unit so that the cleaning target substrates and said nozzle unit vertically move relative to each other; and
   supplying a discharge fluid, which constantly discharges said cleaning fluid from said spaces, from above the cleaning target substrates.

2. A method according to claim 1, wherein the cleaning target substrate are rotated during the step of cleaning the cleaning target substrates.

3. A substrate cleaning apparatus comprising:
   a nozzle unit in which spray nozzle holes are arranged to blow a cleaning fluid toward a plurality of spaces, where a plurality of cleaning target substrates are respectively arranged, from front and back sides simultaneously;
   a cleaning fluid supply unit for supplying a cleaning fluid containing fine argon particles or fine carbon dioxide gas particles to said nozzle unit;
   holding means for fixing the plurality of cleaning target substrates respectively arranged in said plurality of spaces;
   a drive unit for vertically moving either one of the cleaning target substrates and said nozzle unit so that the cleaning target substrates and said nozzle unit vertically move relative to each other;
   a discharge fluid supply unit for supplying a discharge fluid, which forms a flow that causes said cleaning fluid to be constantly discharged from said spaces, from above the cleaning target substrates; and
   a vacuum container accommodating said nozzle unit, said drive unit, said holding means, and said discharge fluid supply unit, and exhaust means for discharging a fluid outside said vacuum container to constantly maintain an interior of said vacuum container in vacuum.

4. An apparatus according to claim 3, wherein said nozzle unit comprises a common pipe for supplying said cleaning fluid and a plurality of nozzle pipes branching from said common pipe in a comb-like manner, and each of said nozzle pipes has a plurality of spray nozzle holes formed at a predetermined pitch.

5. An apparatus according to claim 3, wherein said holding means comprises roller-like retainers each having a U- or V-shaped groove in a circumferential portion thereof, and each one of the cleaning target substrates is fixed with said retainers arranged at at least three portions.

6. An apparatus according to claim 3, wherein each of said spray nozzle holes of said nozzle unit has a diameter that falls within a range of 0.1 mm to 1.0 mm.

7. An apparatus according to claim 3, wherein a vertical movement of either one of said nozzle unit and the cleaning target substrates is performed within a range of 10 to 100 times during a cleaning step.

8. An apparatus according to claim 4, wherein each of said nozzle pipes has a length larger than a diameter of the cleaning target substrate.

* * * * *